United States Patent
Kim et al.

(10) Patent No.: US 9,127,368 B2
(45) Date of Patent: Sep. 8, 2015

(54) ETCHANT AND METHOD FOR MANUFACTURING DISPLAY DEVICE USING THE SAME

(71) Applicants: SAMSUNG DISPLAY CO., LTD., Yongin, Gyeonggi-Do (KR); DONGWOO FINE-CHEM CO., LTD., Iksan-si, Jeollabuk-do (KR)

(72) Inventors: Seon-il Kim, Seoul (KR); In-Bae Kim, Yongin-si (KR); Hongsick Park, Suwon-si (KR); Jong-Hyun Choung, Hwaseong-si (KR); Inseol Kuk, Jeollanam-do (KR); Suckjun Lee, Jeonju-si (KR); Giyong Nam, Anyang-si (KR); Youngchul Park, Iksan-si (KR); Inho Yu, Iksan-si (KR); Youngjin Yoon, Jeonju-si (KR)

(73) Assignees: SAMSUNG DISPLAY CO., LTD., Yongin, Gyeonggi-do (KR); DONGWOO FINE-CHEM CO., LTD., Iksan-si, Jeollabuk-do (KR)

( * ) Notice: Subject to any disclaimer, the term of this patent is extended or adjusted under 35 U.S.C. 154(b) by 0 days.

(21) Appl. No.: 14/318,815

(22) Filed: Jun. 30, 2014

(65) Prior Publication Data
US 2015/0140712 A1    May 21, 2015

(30) Foreign Application Priority Data
Nov. 21, 2013   (KR) .................. 10-2013-0142280

(51) Int. Cl.
*H01L 21/3213*  (2006.01)
*C09K 13/06*    (2006.01)
*C09K 13/08*    (2006.01)
*C23F 1/18*     (2006.01)

(52) U.S. Cl.
CPC . *C23F 1/18* (2013.01); *C09K 13/06* (2013.01); *C09K 13/08* (2013.01); *H01L 21/32134* (2013.01)

(58) Field of Classification Search
None
See application file for complete search history.

(56) References Cited

U.S. PATENT DOCUMENTS

| | | | | |
|---|---|---|---|---|
| 5,532,094 | A * | 7/1996 | Arimura et al. | 216/106 |
| 7,566,404 | B2 * | 7/2009 | Liu et al. | 216/13 |
| 2010/0291722 | A1* | 11/2010 | Kim et al. | 438/38 |
| 2011/0183476 | A1* | 7/2011 | Lee et al. | 438/151 |
| 2012/0252148 | A1* | 10/2012 | Park et al. | 438/34 |
| 2013/0034923 | A1* | 2/2013 | Kim et al. | 438/34 |
| 2014/0038348 | A1* | 2/2014 | Kim et al. | 438/99 |

FOREIGN PATENT DOCUMENTS

| | | |
|---|---|---|
| JP | 2002-030469 A | 1/2002 |
| JP | 2010-045253 A | 2/2010 |
| KR | 10-2008-0008077 A | 1/2008 |
| KR | 10-2012-0051488 A | 5/2012 |

(Continued)

*Primary Examiner* — Scott B Geyer
(74) *Attorney, Agent, or Firm* — Lee & Morse, P.C.

(57) ABSTRACT

An etchant includes, based on a total amount of the etchant, from about 0.5 to about 20 wt % of a persulfate, from about 0.01 to about 2 wt % of a fluorine compound, from about 1 to about 10 wt % of an inorganic acid, from about 0.5 to about 5 wt % of an azole compound, from about 0.1 to about 5 wt % of an electron-donating compound, from about 0.1 to about 5 wt % of a chlorine compound, from about 0.05 to about 3 wt % of a copper salt, from about 0.1 to about 10 wt % of an organic acid or an organic acid salt, and a remaining amount of water.

18 Claims, 14 Drawing Sheets

(56) References Cited

FOREIGN PATENT DOCUMENTS

| KR | 10-2012-0111636 A | 10/2012 |
| KR | 10-2012-0140481 | 12/2012 |
| KR | 10-2013-0008331 A | 1/2013 |
| KR | 10-2013-0069375 A | 6/2013 |
| KR | 10-2013-0070518 | 6/2013 |

\* cited by examiner

ETCHANT AND METHOD FOR MANUFACTURING DISPLAY DEVICE USING THE SAME

CROSS-REFERENCE TO RELATED APPLICATION

Korean Patent Application No. 10-2013-0142280 filed on Nov. 21, 2013, in the Korean Intellectual Property Office, and entitled: "ETCHANT AND METHOD FOR MANUFACTURING DISPLAY DEVICE USING THE SAME," is incorporated by reference herein in its entirety.

BACKGROUND

1. Field

Embodiments relate to an etchant and a method for manufacturing a display device using the same.

2. Description of the Related Art

A display panel is a switching device for driving pixels and may include a display substrate including thin film transistors formed thereon. The display substrate may include a plurality of metal patterns, which may be formed by a photolithography process.

SUMMARY

Embodiments are directed to an etchant including, based on a total amount of the etchant, from about 0.5 to about 20 wt % of a persulfate, from about 0.01 to about 2 wt % of a fluorine compound, from about 1 to about 10 wt % of an inorganic acid, from about 0.5 to about 5 wt % of an azole compound, from about 0.1 to about 5 wt % of an electron-donating compound, from about 0.1 to about 5 wt % of a chlorine compound, from about 0.05 to about 3 wt % of a copper salt, from about 0.1 to about 10 wt % of an organic acid or an organic acid salt, and a remaining amount of water.

The electron-donating compound may be a cyclic organic acid or a cyclic organic acid salt.

The cyclic organic acid may include at least one selected from the group of abietic acid, metanilic acid, riboflavin, folic acid, gallic acid and ascorbic acid. The cyclic organic acid salt may include at least one selected from the group of a potassium salt, a sodium salt, and an ammonium salt of the cyclic organic acid.

The cyclic organic acid salt may include at least one selected from the group of potassium L-ascorbate, calcium L-ascorbate, and sodium L-ascorbate.

The persulfate may include at least one selected from the group of potassium persulfate, sodium persulfate, and ammonium persulfate.

The fluorine compound may include at least one selected from the group of ammonium fluoride, sodium fluoride, potassium fluoride, ammonium bifluoride, sodium bifluoride, and potassium bifluoride.

The inorganic acid may include at least one selected from the group of nitric acid, sulfuric acid, phosphoric acid, and perchloric acid.

The azole compound may include at least one selected from the group of 5-aminotetrazole, 3-amino-1,2,4-triazole, 4-amino-4H-1,2,4-triazole, benzotriazole, imidazole, indole, purine, pyrazole, pyridine, pyrimidine, pyrrole, pyrrolidine, and pyrroline.

The chlorine compound may include at least one selected from the group of hydrochloric acid, sodium chloride, potassium chloride, and ammonium chloride.

The copper salt may include at least one selected from the group of copper nitrate, copper sulfate, and ammonium copper phosphate.

The organic acid may include at least one selected from the group of acetic acid, butanoic acid, citric acid, formic acid, gluconic acid, glycolic acid, malonic acid, oxalic acid, pentanoic acid, sulfobenzoic acid, sulfosuccinic acid, sulfophthalic acid, salicylic acid, sulfosalicylic acid, benzoic acid, lactic acid, glyceric acid, succinic acid, malic acid, tartaric acid, isocitric acid, propenoic acid, iminodiacetic acid and ethylenediaminetetracetic acid. The organic acid salt may include at least one selected from the group of a potassium salt, a sodium salt and an ammonium salt of the organic acid.

The water may be deionized water.

The etchant may further include a metal ion blocking agent or a corrosion preventing agent.

Embodiments are also directed to a method of manufacturing a display device including forming a gate pattern for forming a gate line and a gate electrode connected to each other on a substrate, forming a data pattern for forming a data line insulated from and crossing the gate line, a source electrode connected to the data line and a drain electrode separated from the source electrode, forming a pixel electrode connected to the drain electrode, and forming a common electrode insulated from the pixel electrode. At least one of the forming of the gate pattern and the forming of the data pattern includes forming a metal layer on the substrate, and etching the metal layer using an etchant that includes, based on a total amount of the etchant, from about 0.5 to about 20 wt % of a persulfate, from about 0.01 to about 2 wt % of a fluorine compound, from about 1 to about 10 wt % of an inorganic acid, from about 0.5 to about 5 wt % of an azole compound, from about 0.1 to about 5 wt % of an electron-donating compound, from about 0.1 to about 5 wt % of a chlorine compound, from about 0.05 to about 3 wt % of a copper salt, from about 0.1 to about 10 wt % of an organic acid or an organic acid salt, and a remaining amount of water.

Forming the metal layer on the substrate may include forming a first metal layer on the substrate, and forming a second metal layer on the first metal layer.

The first metal layer may be formed by depositing a metal including copper.

The second metal layer may be formed by depositing a metal including titanium.

The etchant may further include a metal ion blocking agent or a corrosion preventing agent.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
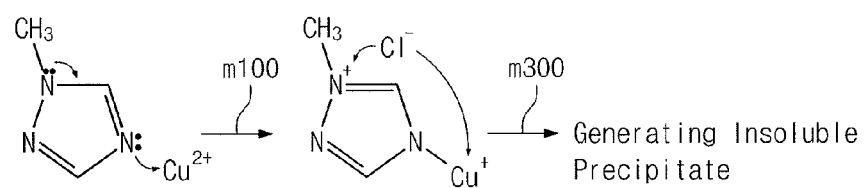
FIG. 1 illustrates a schematic mechanism by which an insoluble precipitate may be generated during etching through a reaction of an azole compound with a copper ion and a chloride ion.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter an etchant according to an embodiment will be described.

The etchant according to this embodiment may include a persulfate, a fluorine compound, an inorganic acid, an azole compound, an electron-donating compound, a chlorine compound, a copper salt, an organic acid or an organic acid salt, and a remaining amount of water.

FIG. 1 illustrates a schematic mechanism by which an insoluble precipitate may be generated during etching through a reaction of an azole compound with a copper ion and a chloride ion.

Referring to FIG. 1, a nitrogen atom (N) having an unshared electron pair in the azole compound and a copper ion may form a coordinate bond (m100). As a result of the formation of the coordinate bond, a relatively positively (+) charged part may be formed in the azole compound. A nucleophilic reaction may occur between a chloride ion and the + charged part, thereby forming an insoluble precipitate (m300).

Figure 2:
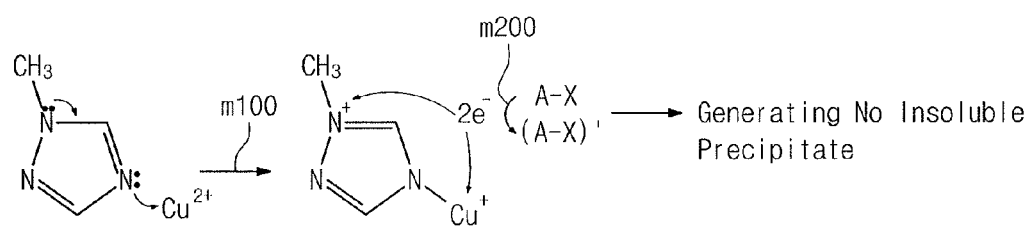
FIG. 2 illustrates a schematic mechanism in which an electron-donating compound inhibits or prevents the generation of an insoluble precipitate during etching.

FIG. 2 illustrates a schematic mechanism in which an electron-donating compound may inhibit or prevent the generation of an insoluble precipitate during etching.

Referring to FIG. 2, the nitrogen atom (N) having an unshared electron pair in the azole compound and a copper ion may form a coordinate bond as in FIG. 1 (m100). However, before the nucleophilic reaction of a chloride ion with the azole compound can occur, an electron-donating compound may provide electrons (m200). Accordingly, the nucleophilic reaction of the chloride ion may be restrained. Thus, the formation of an insoluble precipitate through the reaction of the azole compound with the copper ion and the chloride ion may be prevented, or the likelihood thereof may be reduced.

The etchant according to this embodiment includes the electron-donating compound. Accordingly, the generation of the insoluble precipitate according to a reaction of the azole compound, the copper ion and the chloride ion may be prevented or reduced, or the likelihood thereof may be reduced.

The amount of the electron-donating compound included in the etchant may be, for example, from about 0.1 to about 5 wt % based on the total amount of the etchant. When the amount of the electron-donating compound is about 0.1 wt % or greater, the amount of the electron-donating compound may be sufficient to prevent or reduce the likelihood of the insoluble precipitate being generated. When the amount of the electron-donating compound is about 5 wt % or less, the etching of a metal layer may be sufficiently performed.

The electron-donating compound may be a cyclic organic acid or a cyclic organic acid salt.

A suitable cyclic organic acid may be used. The cyclic organic acid may include at least one selected from the group of abietic acid, metanilic acid, riboflavin, folic acid, gallic acid, and ascorbic acid. The cyclic organic acid salt may be at least one selected from the group of a potassium salt, a sodium salt, and an ammonium salt of the organic acid.

The cyclic organic salt may include at least one selected from the group of potassium L-ascorbate, calcium L-ascorbate, and sodium L-ascorbate.

The persulfate may be a main component for etching a metal layer including copper. The persulfate may be included in the etchant in an amount of, for example, from about 5 to about 20 wt % based on the total amount of the etchant. When the amount of the persulfate is from about 0.5 wt % to about 20 wt %, the metal layer including copper may be etched at a suitable etching rate, and the process of etching may be controlled.

A suitable persulfate may be used. The persulfate may include at least one selected from the group of potassium persulfate ($K_2S_2O_8$), sodium persulfate ($Na_2S_2O_8$), and ammonium persulfate (($NH_4)_2S_2O_8$).

The fluorine compound may be a main component for etching a metal layer including titanium. The fluorine compound may help to remove residues that may be generated during etching.

The fluorine compound may be included in the etchant in an amount of from about 0.01 to about 2 wt % based on the total amount of the etchant. When the amount of the fluorine compound is about 0.01 wt % or greater, a metal layer including titanium may be etched at a suitable rate, and a generation of defects of an etching profile and residues may be avoided. When the amount of the fluorine compound in the etchant is about 2.0 wt % or less, damage to a substrate and an insulating layer may be avoided.

The fluorine compound may be a compound that dissociates into a fluorine ion or a polyatomic fluorine ion in a solution. The fluorine compound may include at least one selected from the group of ammonium fluoride, sodium fluoride, potassium fluoride, ammonium bifluoride, sodium bifluoride, and potassium bifluoride, as examples.

The inorganic acid is an auxiliary oxidant for etching a metal layer including copper and a metal layer including titanium. The inorganic acid may be included in the etchant in an amount of, for example, from about 1 to about 10 wt % based on the total amount of the etchant. When the amount of the inorganic acid is about 1 wt % or greater, the etching rate of the metal layer including copper and the metal layer including titanium may be sufficient, and the defects of an etching profile and generation of residues may be avoided When the amount of the inorganic acid is about 10 wt % or less, overetching chemical attack to at least one of a metal layer and a photoresist layer may be avoided.

A suitable inorganic acid may be used. The inorganic acid may include at least one selected from the group of nitric acid, sulfuric acid, phosphoric acid, and perchloric acid.

The azole compound may help to control the etching rate of a metal layer comprising copper. The azole compound may be included in the etchant in an amount of from about 0.5 to about 5 wt % based on the total amount of the etchant. When the amount of the azole compound is about 0.5 wt % or greater, the etching rate of copper may be controlled, and an over-etching may be avoided. When the amount of the azole compound in the etchant is about 5 wt % or less, the etching rate of copper may be sufficient, and the time necessary for etching may not be prolonged, and a deterioration of productivity may be avoided.

The azole compound may include at least one selected from the group of 5-aminotetrazole, 3-amino-1,2,4-triazole, 4-amino-4H-1,2,4-triazole, benzotriazole, imidazole, indole, purine, pyrazole, pyridine, pyrimidine, pyrrole, pyrrolidine, and pyrroline, as examples.

The chlorine compound may be an auxiliary oxidant for etching a metal layer including copper and may help to control an angle of taper.

The chlorine compound may be included in the etchant in an amount of from about 0.1 to about 5 wt % based on the total amount of the etchant. When the amount of the chlorine is about 0.1 wt % or more, the etching rate of the metal layer comprising copper may be suitable, and defects of an etching profile and residues may be avoided. When the amount of the chlorine compound in the etchant is about 5 wt % or less, an over-etching and a chemical attack to at least one of a metal layer and a photoresist may be avoided.

The chlorine compound may be a compound that dissociates into a chlorine ion. The chlorine compound may include at least one selected from the group of hydrochloric acid (HCl), sodium chloride (NaCl), potassium chloride (KCl) and ammonium chloride ($NH_4Cl$), as examples.

In addition, the copper salt may help control CD skew. Generally, when a feature such as an electrode is formed on a substrate by etching using a wet etching method, a difference may be generated in the length of the electrode before and after the etching. The difference of the length of the electrode or other feature before and after the etching may be referred to as the CD skew. The copper salt may be included in the etchant in an amount of from about 0.05 to about 3 wt % based on the total amount of the etchant When the amount of the copper salt is about 0.05 wt % or greater, the deviation of the CD skew according to the number of the metal layers etched by using the etchant may be controlled. When the amount of the copper salt in the etchant is about 3 wt % or less, a decrease in the oxidizing power of a main oxidant may be avoided, and the presence of excessive copper salt, which could become a factor of decreasing the number of treatment per etchant, may be avoided.

A suitable copper salt may be used. For example, the copper salt may include at least one selected from the group of copper nitrate ($Cu(NO_3)_2$), copper sulfate ($CuSO_4$), and ammonium copper phosphate ($NH_4CuPO_4$).

The etchant may include from about 0.1 to about 10 wt % of an organic acid or an organic acid salt, based on the total amount of the etchant. The organic acid may include at least one selected from the group of acetic acid, butanoic acid, citric acid, formic acid, gluconic acid, glycolic acid, malonic acid, oxalic acid, pentanoic acid, sulfobenzoic acid, sulfosuccinic acid, sulfophthalic acid, salicylic acid, sulfosalicylic acid, benzoic acid, lactic acid, glyceric acid, succinic acid, malic acid, tartaric acid, isocitric acid, propenoic acid, iminodiacetic acid and ethylenediaminetetracetic acid. The organic acid salt may include at least one selected from the group of a potassium salt, a sodium salt, and an ammonium salt of the organic acid.

The etchant may include water in a suitable form for a semiconductor process. The water may be, for example, deionized water having greater than or equal to about 18 MΩ/cm. The amount of the water may be a remaining amount such that the total amount of the etchant becomes about 100 wt %.

In addition, the etchant may further include a metal ion blocking agent or a corrosion preventing agent.

Hereinafter, a method for manufacturing a display device according to an embodiment will be explained.

Figure 3A:
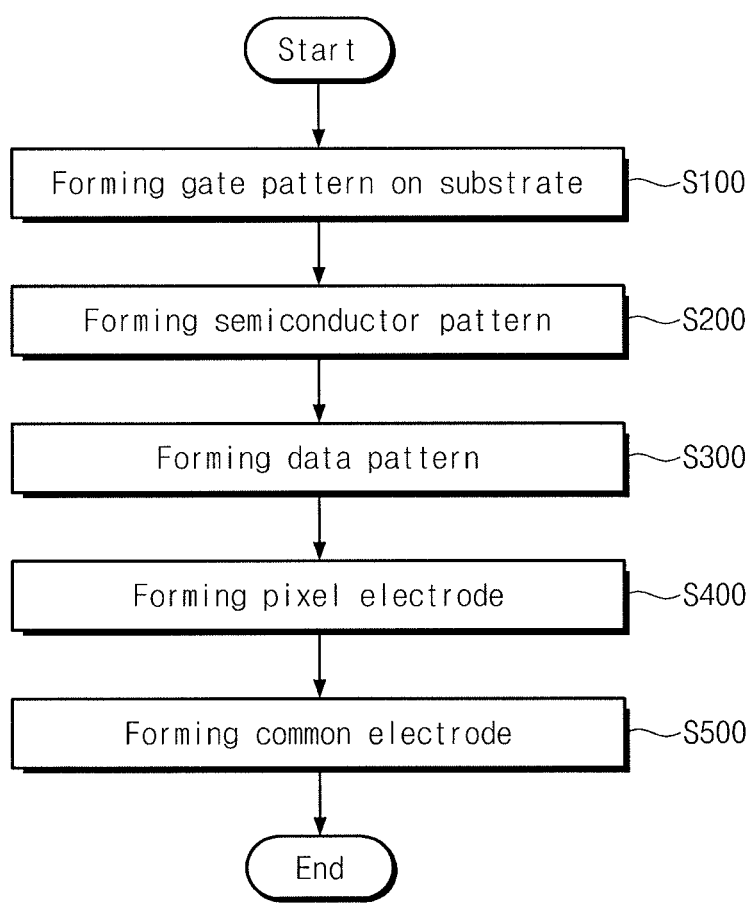
FIGS. 3A and 3B are flowcharts illustrating a method for manufacturing a display device according to an embodiment.
Figure 3B:
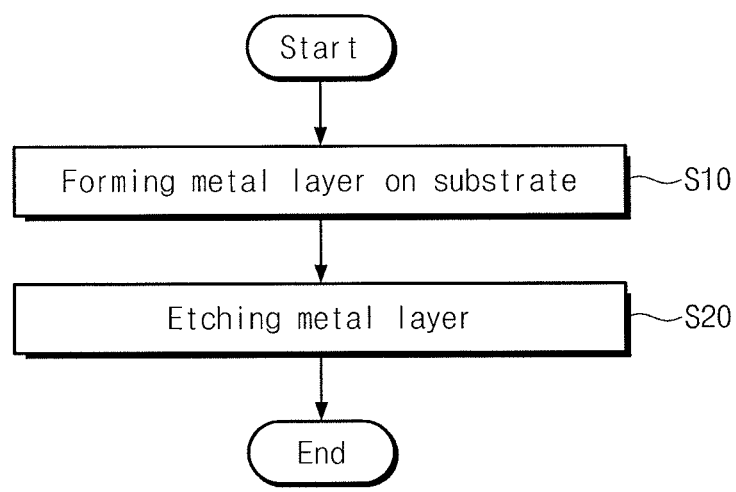

FIGS. 3A and 3B are flowcharts illustrating a method for manufacturing a display device according to an embodiment.

Referring to FIG. 3A, a method for manufacturing a display device according to the embodiment includes forming a gate pattern including a gate line and a gate electrode connected to each other on a substrate (S100), forming a semiconductor pattern on the gate electrode (S200), forming a data pattern including a data line insulated from and crossing the gate line, a source electrode connected to the data line, and a drain electrode separated from the source electrode (S300), forming a pixel electrode connected to the drain electrode (S100), and forming a common electrode insulated from the pixel electrode (S500).

In addition, referring to FIGS. 3A and 3B, at least one of forming the gate pattern forming (S100) and forming the data pattern forming (S300) may include a forming a metal layer on a substrate (S10) and etching the metal layer by using an etchant (S20).

Forming the metal layer on the substrate (S10) may include forming a first metal layer on the substrate and forming a second metal layer on the first metal layer. The first metal layer may be formed by depositing a metal including copper, and the second metal layer may be formed by depositing a metal including titanium.

The etchant may include, based on the total amount of the etchant, from about 0.5 to about 20 wt % of a persulfate, from about 0.01 to about 2 wt % of a fluorine compound, from about 1 to about 10 wt % of an inorganic acid, from about 0.5 to about 5 wt % of an azole compound, from about 0.1 to about 5 wt % of an electron-donating compound, from about 0.1 to about 5 wt % of a chlorine compound, from about 0.05 to about 3 wt % of a copper salt, from about 0.1 to about 10 wt % of an organic acid or an organic acid salt, and a remaining amount of water.

FIGS. 5B, 7B, 8B, and 9B are plan views sequentially illustrating stages of the method for manufacturing a display device according to the embodiment. FIGS. 4, 5A, 6, 7A, 8A and 9A are corresponding cross-sectional views taken along I-I' in FIGS. 5B, 7B, 8B and 9B.

The display device may include an insulating substrate including a plurality of pixel areas, a plurality of gate lines, a plurality of data lines, a plurality of common electrode lines, and a plurality of pixels. Each of the pixels may have the same structure. Accordingly, one pixel among the pixels and two gate lines GL and two data lines DL adjacent to the pixel are illustrated for convenience of explanation.

Figure 10:
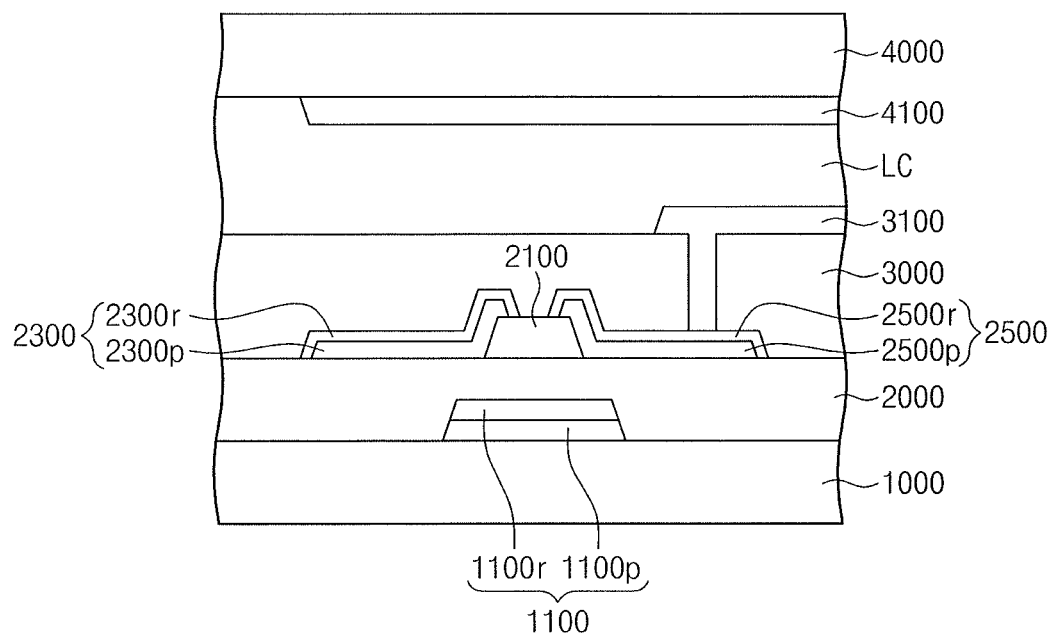

Referring to FIG. 10, the display substrate may include a thin film transistor TFT. The thin film transistor TFT may include a gate electrode 1100 (1100r, 1100p), a gate insulating layer 2000, a semiconductor pattern 2100, a source electrode 2300 (2300r, 2300p), and a drain electrode 2500 (2500r, 2500p). The thin film transistor TFT may be formed by patterning using a photolithography process.

Figure 4:
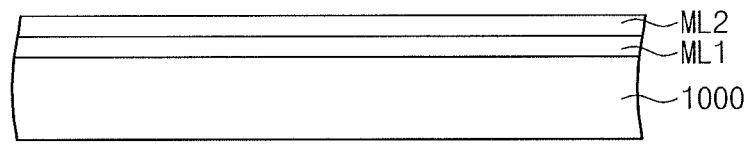
FIGS. 4, 5A, 6, 7A, 8A, and 9A are cross-sectional views taken along I-I' in FIGS. 5B, 7B, 8B, and 9B.

Referring to FIG. 4, a first metal layer ML1 and a second metal layer ML2 may be sequentially stacked on the substrate 1000. The first metal layer may be formed by depositing a metal including copper, and the second metal layer may be formed by depositing a metal including titanium.

Figure 5A:
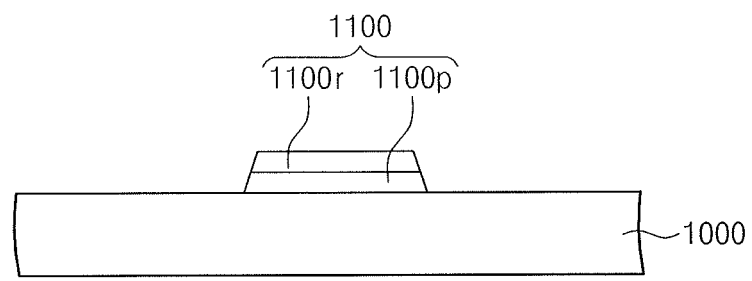
Figure 5B:
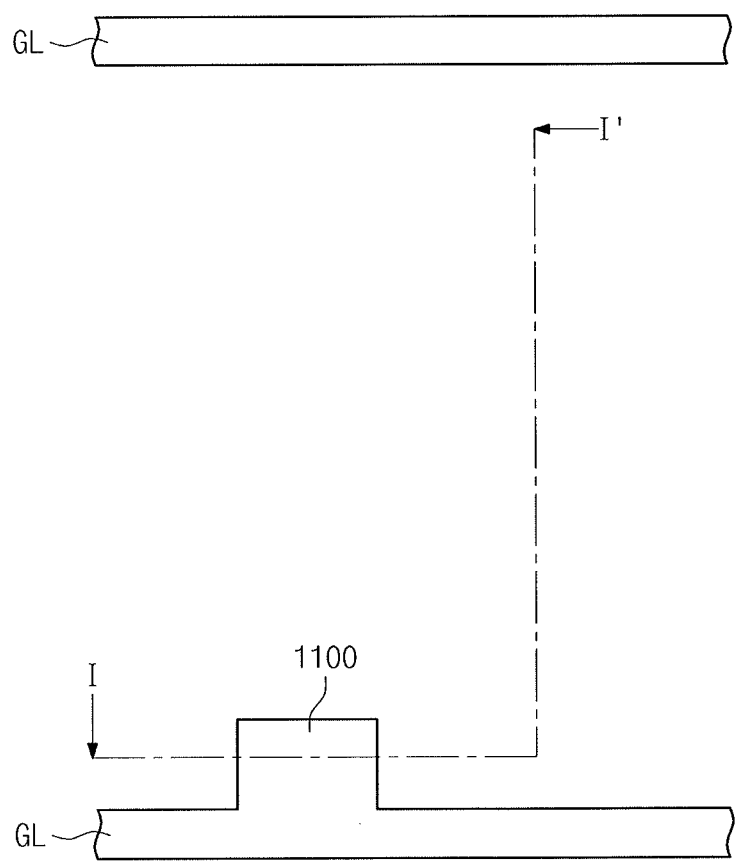
FIGS. 5B, 7B, 8B, and 9B, and 10 are plan views sequentially illustrating stages of a method for manufacturing a display device according to the embodiment.

Referring to FIGS. 3A, 5A, and 5B, the first metal layer ML1 and the second metal layer ML2 may be etched using an etchant, and a gate pattern of a gate line GL and a gate electrode 1100 may be formed on the substrate 1000 (S100). The etchant may include, based on the total amount of the etchant, from about 0.5 to about 20 wt % of a persulfate, from about 0.01 to about 2 wt % of a fluorine compound, from about 1 to about 10 wt % of an inorganic acid, from about 0.5 to about 5 wt % of an azole compound, from about 0.1 to about 5 wt % of an electron-donating compound, from about 0.1 to about 5 wt % of a chlorine compound, from about 0.05 to about 3 wt % of a copper salt, from about 0.1 to about 10 wt % of an organic acid or an organic acid salt, and a remaining amount of water.

Each of the gate line GL and the gate electrode 1100 may be formed as a first gate metal layer 1100$p$ and a second gate metal layer 1100$r$.

Figure 6:
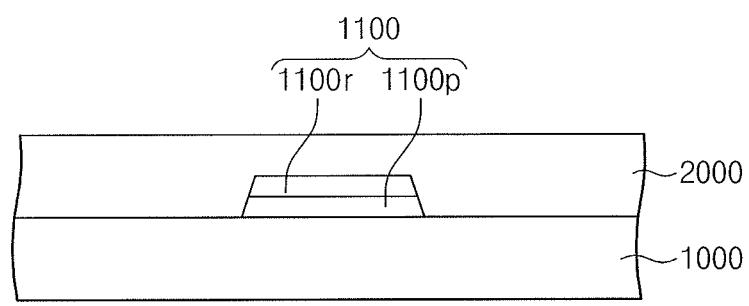

Referring to FIG. 6, a gate insulating layer 2000 may be formed on the substrate 1000 on which the gate electrode 1100 is formed. The gate insulating layer 2000 may be disposed on the gate electrode 1100 and may cover the gate electrode 1100.

Figure 7A:
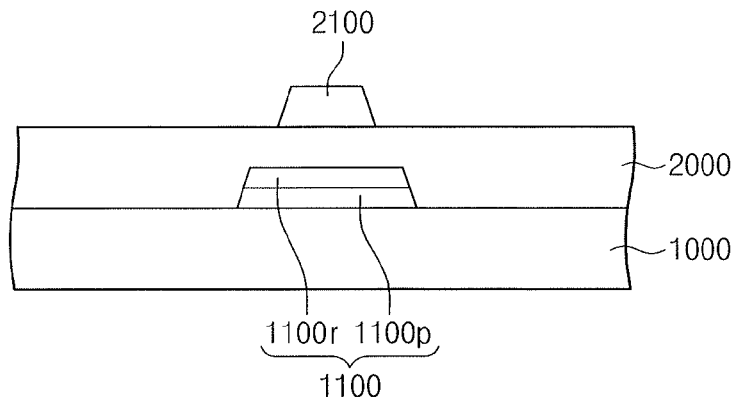
Figure 7B:
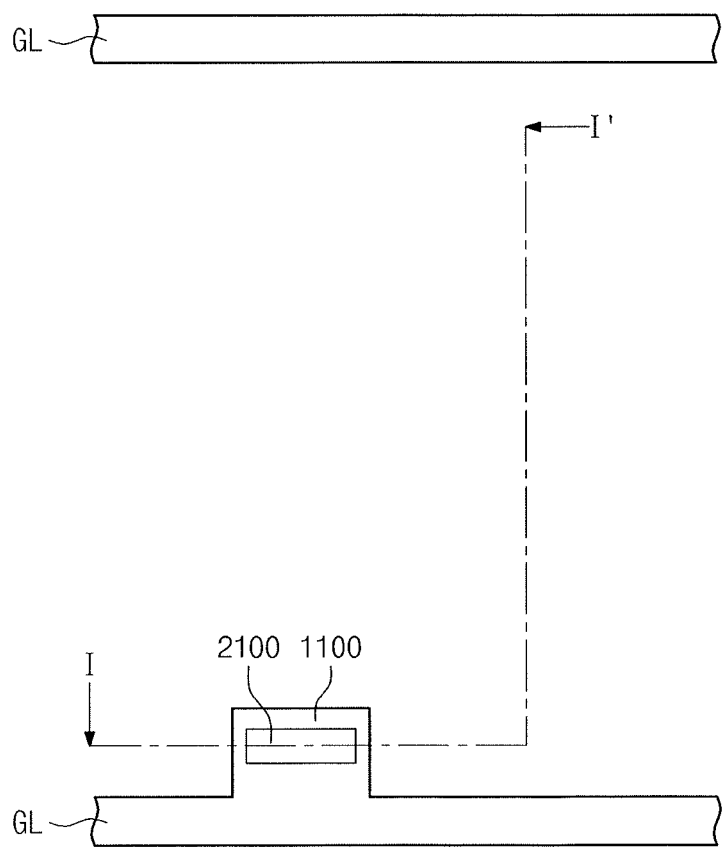

Then, referring to FIGS. 3A, 7A, and 7B, a semiconductor pattern 2100 may be formed on the gate insulating layer 2000 (S200). The semiconductor pattern 2100 may face the gate electrode 1100 with the gate insulating layer 2000 therebetween.

Figure 8A:
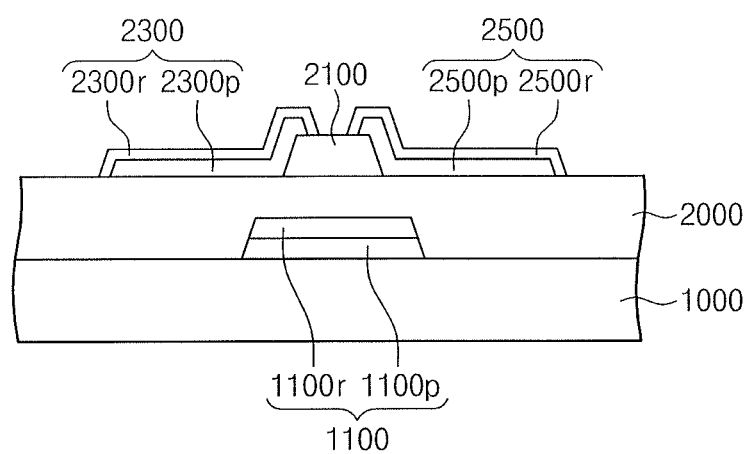
Figure 8B:
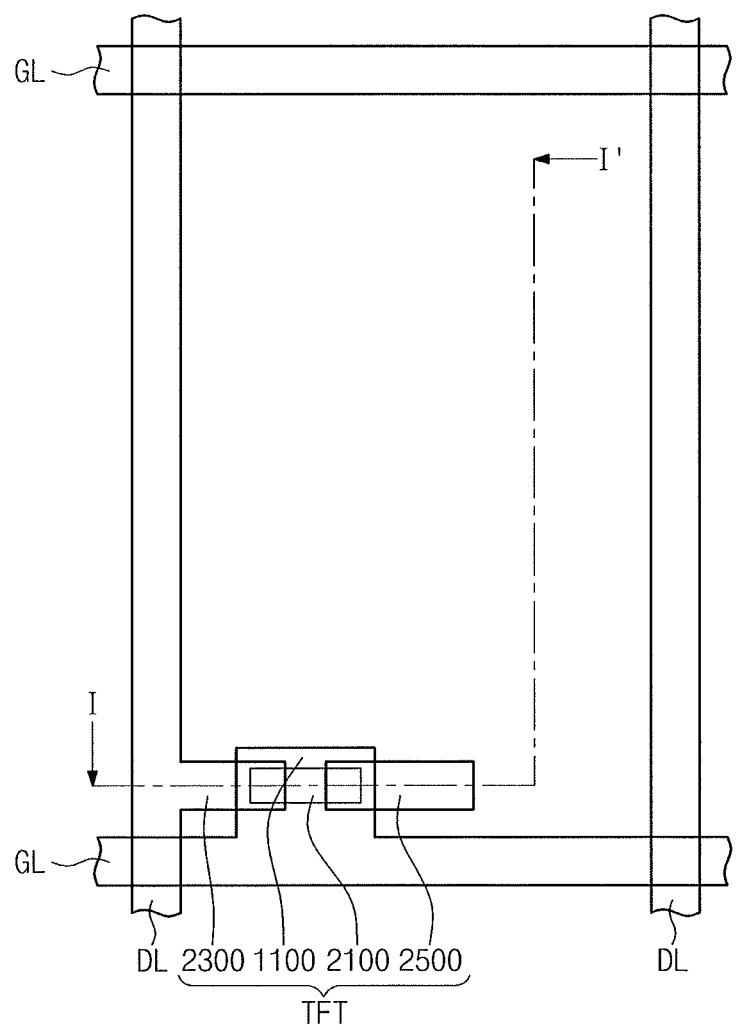

Then, referring to FIGS. 3A, 8A, and 8B, a data pattern may be formed on the semiconductor pattern 2100 (S300). The data pattern may include a data line DL insulated from and crossing the gate line GL, a source electrode 2300 connected to the data line DL and a drain electrode 2500.

The data line DL may be formed by etching a first data metal layer (not shown) formed by depositing a metal including copper and a second data metal layer (not shown) formed by depositing a metal including titanium, using the etchant. The source electrode 2300 may be formed by etching a first source metal layer 2300$p$ formed by depositing a metal including copper and a second source metal layer 2300$r$ formed by depositing a metal including titanium, using the etchant. In addition, the drain electrode 2500 may be formed by etching a first drain metal layer 2500$p$ formed by depositing a metal including copper and a second drain metal layer 2500$r$ formed by depositing a metal including titanium, using the etchant.

The etchant may include, based on the total amount of the etchant, from about 0.5 to about 20 wt % of a persulfate, from about 0.01 to about 2 wt % of a fluorine compound, from about 1 to about 10 wt % of an inorganic acid, from about 0.5 to about 5 wt % of an azole compound, from about 0.1 to about 5 wt % of an electron-donating compound, from about 0.1 to about 5 wt % of a chlorine compound, from about 0.05 to about 3 wt % of a copper salt, from about 0.1 to about 10 wt % of an organic acid or an organic acid salt, and a remaining amount of water.

The source electrode 2300 and the drain electrode 2500 may be separated from each other and may be connected to the semiconductor pattern 2100.

Figure 9A:
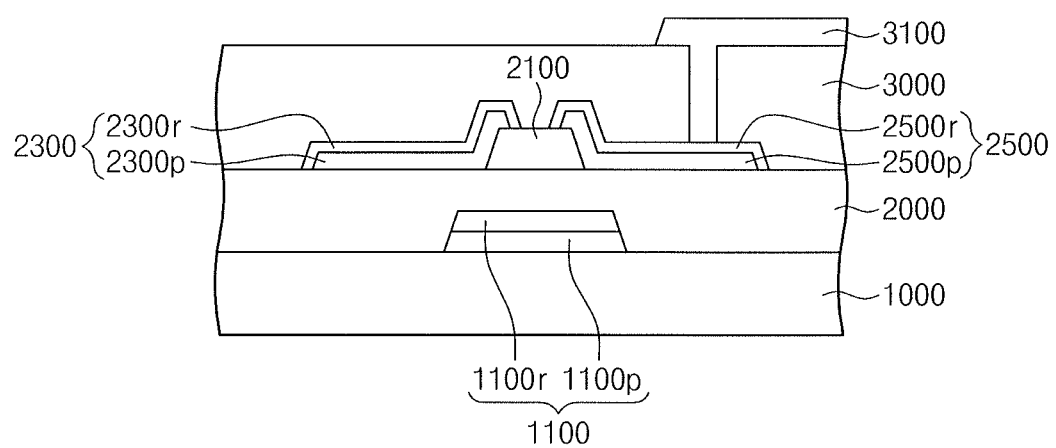
Figure 9B:
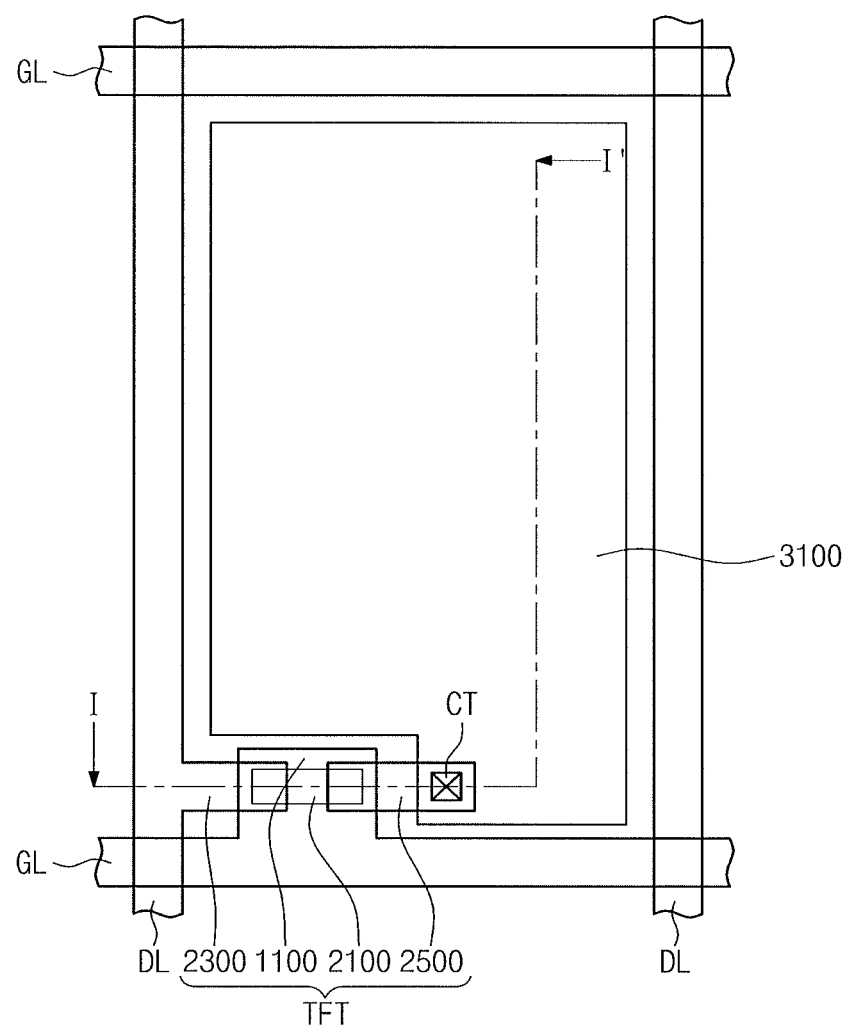

Referring to FIG. 9A, an insulating layer 3000 may be formed on the source electrode 2300 and the drain electrode 2500. On the insulating layer 3000, a contact hole CT exposing a portion of the top surface of the drain electrode 2500 may be formed. In addition, referring to FIGS. 3A, 9A, and 9B, a transparent electrode may be patterned on the insulating layer 3000 to form a pixel electrode 3100 (S400). The pixel electrode 3100 may be disposed on the insulating layer 3000 and may form an electrical connection with the drain electrode 2500 through the contact hole CT.

Then, referring to FIGS. 3A and 10, a common electrode 4100 insulated from the pixel electrode 3100 may be formed (S500). The common electrode 4100 may be formed on a color filter substrate 4000 or on the substrate 1000 on which the thin film transistor TFT is formed.

In addition, a liquid crystal layer LC may be formed between the substrate 1000 on which the thin film transistor TFT is formed and the color filter substrate 4000.

When a display device is manufactured by the method for manufacturing a display device according to this embodiment, a metal layer may be etched by using an etchant according to the embodiment, and generation of an insoluble precipitate may be prevented or avoided. The composition of the etchant may be the same as the etchant previously described, and detailed description thereon will not be repeated herein. The etchant may further include a metal ion blocking agent or a corrosion preventing agent.

The following Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it is to be understood that the embodiments are not limited to the particular details described in the Examples and Comparative Examples.

EXAMPLE 1

As illustrated in the following Table 1, 10 kg of an etchant including 10 wt % of sodium persulfate, 0.5 wt % of ammonium bifluoride, 3 wt % of nitric acid, 1.5 wt % of 5-aminotetrazole, 1.5 wt % of sodium chloride, 0.2 wt % of copper sulfate, 3 wt % of acetic acid, 0.3 wt % of riboflavin, and a remaining amount of water based on the total amount of the etchant was prepared.

EXAMPLE 2

10 kg of an etchant including the same components in the same amounts as Example 1 was prepared, except that 0.3 wt % of folic acid was used instead of riboflavin as an electron-donating compound.

EXAMPLE 3

10 kg of an etchant including the same components in the same amounts as Example 1 was prepared, except that 0.3 wt % of gallic acid was used instead of riboflavin as an electron-donating compound.

EXAMPLE 4

10 kg of an etchant including the same components in the same amounts as Example 1 was prepared, except that 0.3 wt % of potassium L-ascorbate was used instead of riboflavin as an electron-donating compound.

COMPARATIVE EXAMPLE 1

10 kg of an etchant comprising the same components by the same amounts as Example 1 was prepared except for excluding the 0.3 wt % of riboflavin.

TABLE 1

|  |  | Example 1 | Example 2 | Example 3 | Example 4 | Comparative Example 1 |
|---|---|---|---|---|---|---|
| Sodium persulfate | | 10 | 10 | 10 | 10 | 10 |
| Ammonium bifluoride | | 0.5 | 0.5 | 0.5 | 0.5 | 0.5 |
| Nitric acid | | 3 | 3 | 3 | 3 | 3 |
| 5-aminotetrazole | | 1.5 | 1.5 | 1.5 | 1.5 | 1.5 |
| Sodium chloride | | 1.5 | 1.5 | 1.5 | 1.5 | 1.5 |
| Copper sulfate | | 0.2 | 0.2 | 0.2 | 0.2 | 0.2 |
| Acetic acid | | 3 | 3 | 3 | 3 | 3 |
| Electron-donating compound | Riboflavin | 0.3 | — | — | — | — |
| | Folic acid | — | 0.3 | — | — | — |
| | Gallic acid | — | — | 0.3 | — | — |
| | Potassium L-ascorbate | — | — | — | 0.3 | — |
| Precipitate | 1 day | None | None | None | None | Generated |
| | 7 days | None | None | None | None | Increased |
| | 15 days | None | None | None | None | Increased |

Experimental Example

Evaluation of the Generation of Precipitate

Generation of a precipitate was evaluated with respect to the etchants of Examples 1 to 4 and Comparative Example 1 as follows.

Figure 11:
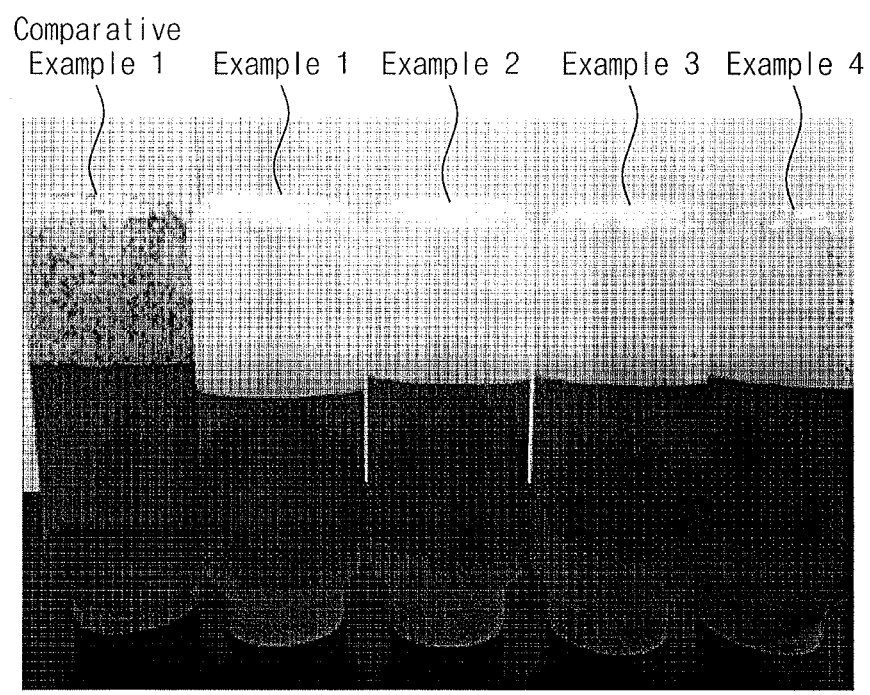
FIG. 11 illustrates a photographic image taken before dissolving a copper powder in etchants according to Examples 1 to 4 and Comparative Example 1.
Figure 12:
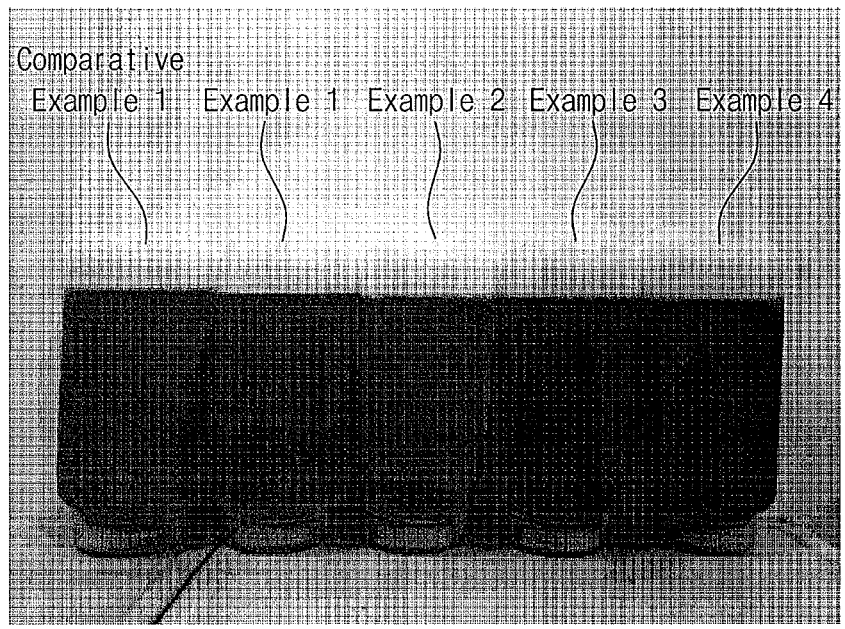
FIG. 12 illustrates a photographic image taken after dissolving a copper powder in etchants according to Examples 1 to 4 and Comparative Example 1, and storing at −9° C.

First, a photographic image on the etchants according to Examples 1 to 4 and Comparative Example 1 was taken, as illustrated in FIG. 11. Into the etchants according to Examples 1 to 4 and Comparative Example 1, 3000 ppm of a copper powder was added, and completely dissolved for about 30 minutes using a stirrer. The solution thus obtained was poured into a polyethylene bottle and stored at −9° C. The generation of a precipitate was observed and a photograph thereof was taken. The photographic image is illustrated in FIG. 12. The results obtained from the use of the etchants according to Examples 1 to 4 and Comparative Example 1 are summarized in the above Table 1.

As illustrated in the above Table 1, and FIGS. 11 and 12, no precipitate was generated when the copper powder was dissolved in the etchants according to Examples 1 to 4 and stored at −9° C. However, referring to Table 1, FIGS. 11 and 12, a precipitate was generated when the copper powder was dissolved in the etchant according to Comparative Example 1, which did not include the electron-donating compound, and stored at −9° C.

By way of summation and review, according to a photolithography process, a photoresist layer is formed on a thin film to be etched formed on the substrate, exposing and developing the photoresist layer to form a photoresist pattern, and patterning the thin film through etching the thin film using an etchant by using the photoresist pattern as an etch stopping layer.

When the thin film to be etched includes copper (Cu), a peroxide etchant or a non-peroxide etchant may be used as the etchant. A peroxide etchant includes hydrogen peroxide as a main oxidant. Hydrogen peroxide may be difficult and dangerous to handle because of a risk of self-decomposition thereof, and additional equipment may be needed for performing a process when a peroxide etchant is used.

The use of a non-peroxide etchant excluding the hydrogen peroxide as the main oxidant has increased in recent years. However, a non-peroxide etchant may react with copper ions and chloride ions and generate a precipitate.

Embodiments provide an etchant that does not generate a precipitate during etching and a method for manufacturing a display device using the same. By using the etchant according to embodiments, a precipitate may not be generated during performing an etching process. By the method for manufacturing a display device according to embodiments, a precipitate may not be generated during performing an etching process.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A method of manufacturing a display device, the method comprising:
    forming a gate pattern for forming a gate line and a gate electrode connected to each other on a substrate;
    forming a data pattern for forming a data line insulated from and crossing the gate line, a source electrode connected to the data line and a drain electrode separated from the source electrode;
    forming a pixel electrode connected to the drain electrode; and
    forming a common electrode insulated from the pixel electrode,
    wherein at least one of the forming of the gate pattern and the forming of the data pattern includes:
    forming a metal layer on the substrate; and
    etching the metal layer using an etchant that includes, based on a total amount of the etchant:
    from about 0.5 to about 20 wt % of a persulfate;
    from about 0.01 to about 2 wt % of a fluorine compound;
    from about 1 to about 10 wt % of an inorganic acid;
    from about 0.5 to about 5 wt % of an azole compound;
    from about 0.1 to about 5 wt % of an electron-donating compound;
    from about 0.1 to about 5 wt % of a chlorine compound;
    from about 0.05 to about 3 wt % of a copper salt;
    from about 0.1 to about 10 wt % of an organic acid or an organic acid salt; and
    a remaining amount of water.

2. The method for manufacturing a display device as claimed in claim 1, wherein forming the metal layer on the substrate includes:
    forming a first metal layer on the substrate; and
    forming a second metal layer on the first metal layer.

3. The method for manufacturing a display device as claimed in claim 2, wherein the first metal layer is formed by depositing a metal including copper.

4. The method for manufacturing a display device as claimed in claim 2, wherein the second metal layer is formed by depositing a metal including titanium.

5. The method for manufacturing a display device as claimed in claim 1, wherein the etchant further includes a metal ion blocking agent or a corrosion preventing agent.

6. An etchant, comprising, based on a total amount of the etchant:
from about 0.5 to about 20 wt % of a persulfate;
from about 0.01 to about 2 wt % of a fluorine compound;
from about 1 to about 10 wt % of an inorganic acid;
from about 0.5 to about 5 wt % of an azole compound;
from about 0.1 to about 5 wt % of an electron-donating compound;
from about 0.1 to about 5 wt % of a chlorine compound;
from about 0.05 to about 3 wt % of a copper salt;
from about 0.1 to about 10 wt % of an organic acid or an organic acid salt; and
a remaining amount of water.

7. The etchant as claimed in claim 6, wherein the electron-donating compound is a cyclic organic acid or a cyclic organic acid salt.

8. The etchant as claimed in claim 7, wherein;
the cyclic organic acid includes at least one selected from the group of abietic acid, metanilic acid, riboflavin, folic acid, gallic acid and ascorbic acid,
and the cyclic organic acid salt includes at least one selected from the group of a potassium salt, a sodium salt, and an ammonium salt of the cyclic organic acid.

9. The etchant as claimed in claim 8, wherein the cyclic organic acid salt includes at least one selected from the group of potassium L-ascorbate, calcium L-ascorbate, and sodium L-ascorbate.

10. The etchant as claimed in claim 6, wherein the persulfate includes at least one selected from the group of potassium persulfate, sodium persulfate, and ammonium persulfate.

11. The etchant as claimed in claim 6, wherein the fluorine compound includes at least one selected from the group of ammonium fluoride, sodium fluoride, potassium fluoride, ammonium bifluoride, sodium bifluoride, and potassium bifluoride.

12. The etchant as claimed in claim 6, wherein the inorganic acid includes at least one selected from the group of nitric acid, sulfuric acid, phosphoric acid, and perchloric acid.

13. The etchant as claimed in claim 6, wherein the azole compound includes at least one selected from the group of 5-aminotetrazole, 3-amino-1,2,4-triazole, 4-amino-4H-1,2,4-triazole, benzotriazole, imidazole, indole, purine, pyrazole, pyridine, pyrimidine, pyrrole, pyrrolidine, and pyrroline.

14. The etchant as claimed in claim 6, wherein the chlorine compound includes at least one selected from the group of hydrochloric acid, sodium chloride, potassium chloride, and ammonium chloride.

15. The etchant as claimed in claim 6, wherein the copper salt includes at least one selected from the group of copper nitrate, copper sulfate, and ammonium copper phosphate.

16. The etchant as claimed in claim 6, wherein:
the organic acid includes at least one selected from the group of acetic acid, butanoic acid, citric acid, formic acid, gluconic acid, glycolic acid, malonic acid, oxalic acid, pentanoic acid, sulfobenzoic acid, sulfosuccinic acid, sulfophthalic acid, salicylic acid, sulfosalicylic acid, benzoic acid, lactic acid, glyceric acid, succinic acid, malic acid, tartaric acid, isocitric acid, propenoic acid, iminodiacetic acid and ethylenediaminetetracetic acid,
and the organic acid salt includes at least one selected from the group of a potassium salt, a sodium salt and an ammonium salt of the organic acid.

17. The etchant as claimed in claim 6, wherein the water is deionized water.

18. The etchant as claimed in claim 6, further comprising a metal ion blocking agent or a corrosion preventing agent.

* * * * *